US006204839B1

United States Patent
Mato, Jr.

(10) Patent No.: US 6,204,839 B1
(45) Date of Patent: *Mar. 20, 2001

(54) CAPACITIVE SENSING KEYBOARD AND POINTING DEVICE

(75) Inventor: Stephan A. Mato, Jr., Katy, TX (US)

(73) Assignee: Compaq Computer Corporation, Houston, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/884,242

(22) Filed: Jun. 27, 1997

(51) Int. Cl.⁷ ..................................................... G09G 5/00
(52) U.S. Cl. .......................... 345/168; 345/156; 345/157; 345/158; 341/22; 341/24; 341/26; 341/33
(58) Field of Search .................................. 345/157, 168, 345/156, 158; 341/22, 24, 26, 33

(56) References Cited

U.S. PATENT DOCUMENTS

| | | | |
|---|---|---|---|
| 4,288,836 | * | 9/1981 | Thornburg et al. .................. 200/600 |
| 4,313,113 | * | 1/1982 | Thornburg ........................... 345/159 |
| 4,379,287 | * | 4/1983 | Tyler et al. .......................... 340/365 |
| 4,417,294 | * | 11/1983 | Herron, Jr. .......................... 361/288 |
| 4,918,262 | * | 4/1990 | Flowers et al. ....................... 178/18 |
| 5,252,971 | * | 10/1993 | Franz et al. .......................... 341/26 |
| 5,424,756 | * | 6/1995 | Ho et al. ............................. 345/158 |
| 5,528,235 | * | 6/1996 | Lin et al. ............................. 341/22 |
| 5,675,361 | * | 10/1997 | Santilli ................................ 345/168 |
| 5,736,976 | * | 4/1998 | Cheung ............................... 345/168 |
| 5,821,922 | * | 10/1998 | Sellers ................................ 345/157 |
| 5,864,334 | * | 1/1999 | Sellers ................................ 345/168 |
| 5,880,411 | * | 3/1999 | Gillespie et al. .................. 178/18.01 |
| 5,889,236 | * | 3/1999 | Gillespie et al. .................. 178/18.01 |
| 5,889,507 | * | 3/1999 | Engle et al. ......................... 345/161 |
| 5,977,954 | * | 11/1999 | Arimoto et al. ..................... 345/168 |
| 6,061,050 | * | 5/2000 | Allport et al. ....................... 345/173 |

OTHER PUBLICATIONS

Paradiso & Gershenfeld, "*Musical Applications of Electric Field Sensing*", Physics and Media Group, MIT Media Laboratory, Cambridge, MA 02139, Oct. 1995.

Smith, "*Field Mice : Extracting Hand Geometry From Electric Field Measurements*", Physics and Media Group, MIT Media Lab, Cambridge, MA 02139, Dec. 1995.

Phillipp, "*The Charge Transfer Sensor*", Sensors Magazine, Nov., 1996, pp. 36–42.

* cited by examiner

Primary Examiner—Richard Hjerpe
Assistant Examiner—Henry N. Tran

(57) ABSTRACT

A combination keyboard and pointing device is incorporated in a portable computer and includes a dielectric base member on a top side of which a spaced series of electrically conductive pad member portions of a capacitance-based proximity sensing system are formed. Manually depressible key members are positioned above the pads. With the sensing system switched to a typing mode, the pads capacitively sense the proximity, velocity and acceleration of a user's fingers depressing their associated keys and output signals useable by the computer to display the character associated with the depressed key. A sensed increased stroke velocity of each manually depressed key may be used to alter the key character image displayed on the screen, for example capitalizing, bolding or underlining the character. The sensing system may be manually or automatically switched from its typing mode to a pointing mode in which it capacitively senses various hand and finger motions and orientations to carry out various pointing functions, such as cursor movements, pick functions, and scrolling functions, in response to the sensed hand and finger motions and orientations.

16 Claims, 4 Drawing Sheets

CAPACITIVE SENSING KEYBOARD AND POINTING DEVICE

Background of the Invention

1. Field of the Invention

The present invention generally relates to electronic apparatus and, in a preferred embodiment thereof, more particularly relates to keyboard and cursor control apparatus for computers.

2. Description of Related Art

In a commonly utilized computer keyboard of conventional construction, utilized in both portable computers and desktop computer systems, a series of manually depressible key cap members are supported above a multi-layer membrane switch structure for downward movement, through a key stroke distance, toward segmented switch structures disposed beneath each key member. Also underlying the key members are key return spring members, such as elastomeric dome structures, which function to resiliently bias the keys to their upwardly extended pre-typing positions. While this multi-layer signal pad and electrical switch structure has proven to be satisfactory from a functional standpoint, it nevertheless has several disadvantages such as structural and fabricational complexity, bulk, and an increased potential for fatigue and other mechanical and electrical wear and failure problems.

In conjunction with these conventionally constructed portable and desktop computer keyboard structures, a variety of display screen cursor control systems have previously been utilized on or adjacent the keyboard. These cursor control devices include mice, trackballs, touchpads and pointing sticks.

The computer mouse is basically a small housing which has a ball on its underside that is rolled by the computer user along a horizontal support surface adjacent the keyboard in response to hand movement of the mouse housing parallel to the support surface. The sense and speed of the rotation of the mouse ball is monitored and appropriately converted to a positional output signal used to correspondingly reposition the cursor on the computer. The mouse housing typically has at least one "pick" button thereon which may be depressed to select an icon to which the cursor has been moved, or simply to select a desired screen location.

A track ball is basically an inverted mouse with the ball facing upwardly for direct manipulation by the computer user's fingers. The track ball is typically mounted on the base housing of a portable computer adjacent one or more "pick" buttons associated with the ball.

A touchpad typically has a small, generally planar rectangular surface along which the user runs his finger in the desired direction of cursor movement. A sensing structure beneath the user-engaged surface converts his finger movements to appropriate cursor movement signals. As in the case of the track ball and mouse, the touchpad is typically placed adjacent one or more manually depressible "pick" buttons.

A pointing stick is typically placed among and projects upwardly beyond a group of keyboard key cap members —typically in a generally central location of the keyboard between the user's index fingers in their "home" typing positions. Either index finger may be used to tilt the vertically oriented pointing stick in the desired direction of cursor movement, with a pressure sensing base portion of the pointing stick structure detecting the rocking movement of the stick and transforming the detected stick into corresponding cursor movement signals.

A recent potential addition to these types of cursor control devices, a two dimensional optical digitizer device, is illustrated and described in pending U.S. application Ser. No. 08/486,310, filed on Jun. 7, 1995, and pending U.S. application Ser. No. 08/651,881, filed on Jun. 4, 1996, each of such pending applications being assigned to the same assignee as this application. These digitizer devices utilize a single source of light to form a generally planar two dimensional light pattern disposed over and generally parallel to a computer keyboard. A finger placed in the light pattern interrupts a corresponding portion thereof, with the interruption location being sensed and used to transmit positional information to the display screen.

As in the case of their associated keyboard structures, various problems, limitations and disadvantages are typically associated with these previously proposed types of cursor control devices and systems. It is to these keyboard and cursor control apparatus problems, limitations and disadvantages that the present invention is directed.

For example, with respect to the cursor control devices and systems, the computer mouse requires a substantial amount of unobstructed desktop space adjacent the keyboard to be moved around in. Also, many computer mice are configured for right hand use, making them awkward for the left-handed user. The trackball is typically integrated into the system keyboard area in a fixed location which is usually a comprise based on where there is space in the system. Accordingly, the trackball can often be somewhat awkward to use.

The touchpad, like the trackball, is typically integrated into a fixed area of the system keyboard structure. Additionally, the touchpad typically has a relatively small surface area along which the user's finger can be moved to correspondingly move the display screen cursor. Accordingly, the touchpad tends to be rather inconvenient to use when long cursor movements are required.

The pointing stick is the smallest of the conventionally utilized cursor positioning devices and thus may be very compactly located on the keyboard structure. However, the small size of this device makes it somewhat difficult for some users to properly engage and use. Additionally, since the pointing stick is usually centrally located in the keyboard it usually must be separated a substantial distance from its associated selection buttons. This, too, is often considered undesirable by computer users. Moreover, due to the "rocking" motion that must be imparted to the pointing stick to operate it, the use of the stick is considered by many users to be at least to some degree counterintuitive.

The optical digitizers mentioned above require for the generation and maintenance of their optical fields above and generally parallel to the keyboard a variety of reflector, interceptor and light generating members mounted in exposed orientations on the keyboard. Additionally, their optical fields as a practical matter are limited to two dimensions, thereby limiting their object recognition capabilities.

In view of the foregoing it can be seen that it would be desirable to provide for a computer improved keyboard and cursor control apparatus which eliminates or at least substantially reduces the above-mentioned problems, limitations and disadvantages typically associated with previously proposed keyboard and cursor control apparatus.

SUMMARY OF THE INVENTION

In carrying out principles of the present invention, in accordance with a preferred embodiment thereof, electronic apparatus is provided which is representatively a portable computer having a screen portion upon which typing characters and a movable cursor may be displayed. Incorporated in the computer is a specially designed combination keyboard/pointing device which includes a support member having a top side, and a series of keys carried on the support member for movement through stroke distances toward its top side.

According to a feature of the invention the combination keyboard/pointing device further includes capacitance-based proximity sensing circuitry which is switchable between (1) a typing mode in which the circuitry capacitively senses changes in the proximity to the top support member side of a user's fingers as they operatively depress selected keys, and responsively outputs signals useable to generate corresponding typing characters on the screen, and (2) a pointing mode in which the circuitry capacitively senses predetermined user hand orientations and movements upwardly adjacent the keys and responsively generates signals useable to control the movable cursor or other user-defined functions.

According to another aspect of the invention the circuitry, when in its typing mode, is operative to capacitively sense the key stroke velocity of each key, by capacitively sensing the velocity of the finger depressing the key, and responsively generate (1) a first signal useable to display on the screen a first key character image when the sensed key stroke velocity of the key is in a first predetermined range, and (2) a second signal useable to display on a screen a second key character image when the sensed key stroke velocity of the key is in a second predetermined range.

The switching between the typing and pointing modes of the circuitry is representatively effected using a manual switch located near the keyboard, or by using the circuitry itself to sense a predetermined hand orientation and motion and automatically switch from the typing mode to the pointing mode.

In a preferred embodiment thereof, the capacitance-based proximity sensing circuitry includes a spaced series of electrically conductive pad structures underlying the keys in registry therewith, and means for impressing predetermined alternating wave forms on the pad structures. The circuitry also includes multiplexing switch circuitry having an input side connected to the pad structures, and an output side; analog electrical circuitry having an input side connected to the output side of the switch circuitry, and an output side. The analog electrical circuitry is operative to sense capacitance changes at the pad structures caused by changes in proximity of objects adjacent thereto, and responsively generate analog output signals. The analog output signals are received by digital electrical circuitry which converts them to digital signals and transmits the digital signals to control circuitry incorporated in the computer.

In accordance with other features of the invention, the capacitance-based proximity sensing circuitry is operative to cause the pad structures to function as electrical transceivers during the typing mode, and during the pointing mode. Alternatively, during the pointing mode the proximity sensing circuitry is operative to cause at least one of the pad structures to function solely as an electrical transmitter, and to cause at least a portion of the balance of the pad structures to function solely as electrical receivers.

Illustratively, the support member is a dielectric plate member, and each key has associated therewith a spring structure operative to resiliently bias the key toward an outwardly extended position relative to the top side of the plate member, and a stop structure operative to prevent the key from contacting its underlying pad structure when the key is depressed through its full stroke distance.

DETAILED DESCRIPTION

Figure 1:
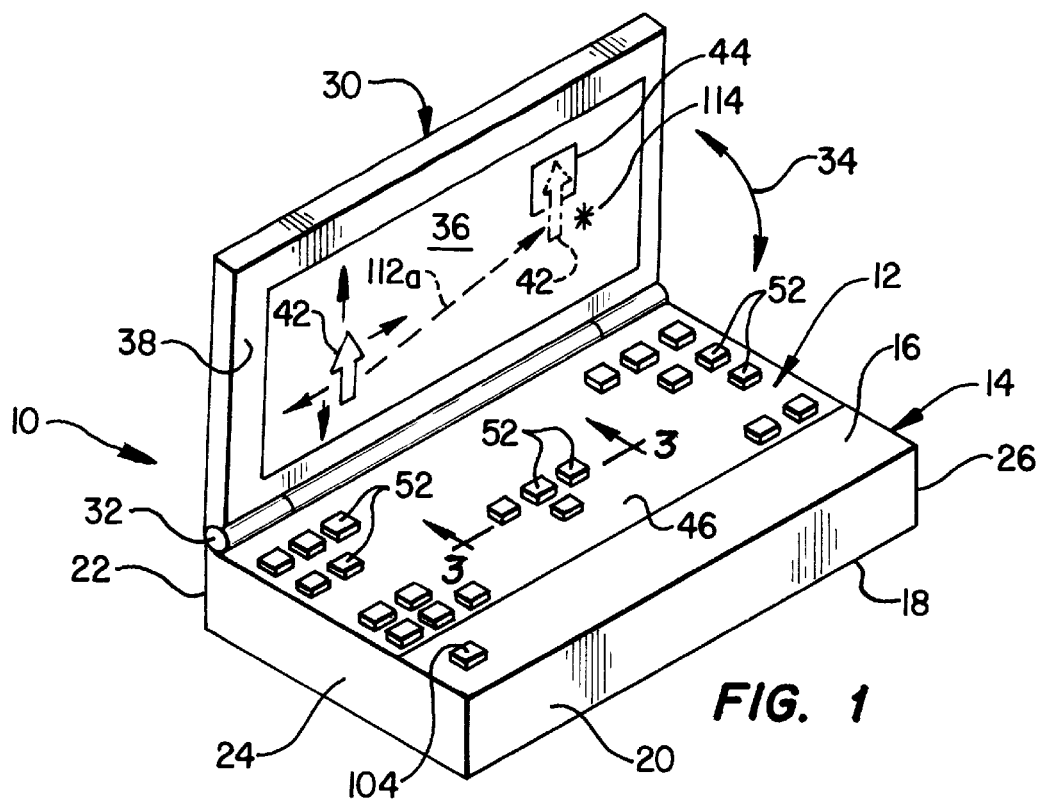
FIG. 1 is a simplified perspective view of a representative portable computer incorporating therein a specially designed capacitive sensing-based combination keyboard and pointing device embodying principles of the present invention.

Perspectively illustrated in simplified form in FIG. 1 is a representative portable notebook computer which incorporates therein a specially designed combination keyboard and pointing assembly 12 that embodies principles of the present invention and is subsequently described in detail herein. The portable computer 10 includes a rectangular base housing 14 which is restable on a suitable horizontal support surface (not shown) and has top and bottom sides 16 and 18, front and rear sides 20 and 22, and left and right ends 24 and 26.

In addition to the base housing 14 the computer 10 also includes a somewhat thinner rectangular lid housing 30 which is hinge-secured, as at 32, to a rear top side portion of the base housing 14 for pivotal movement relative thereto (as indicated by the double-ended arrow 34 in FIG. 1) between a generally upright open use orientation (shown in FIG. 1) in which the lid housing 30 exposes the keyboard and pointing assembly 12, and a downwardly tilted closed storage and transport orientation in which the lid housing 30 extends across and parallel to the top base housing side 16 and covers the keyboard and pointing assembly 12. Suitable latch means (not shown) are provided for releasably locking the lid housing 30 in this closed storage and transport orientation thereof.

Lid housing 30 has a rectangular display screen 36 mounted on the front or inner side 38 thereof, the display screen 36 facing forwardly and being exposed to user view, as shown in FIG. 1, when the lid housing 30 is in its open use orientation. Computer 10 is provided with control circuitry 40 (see FIG. 5) which is operative to display on the screen 36 a cursor 42 and a selectable icon 44. As later described herein, the keyboard/pointing assembly 12 is operative in response to user hand movement therealong to move the cursor 42 upwardly, downwardly, leftwardly and rightwardly along the display screen 36 as indicated by the movement arrows adjacent the cursor 42 in FIG. 1.

Figure 2:
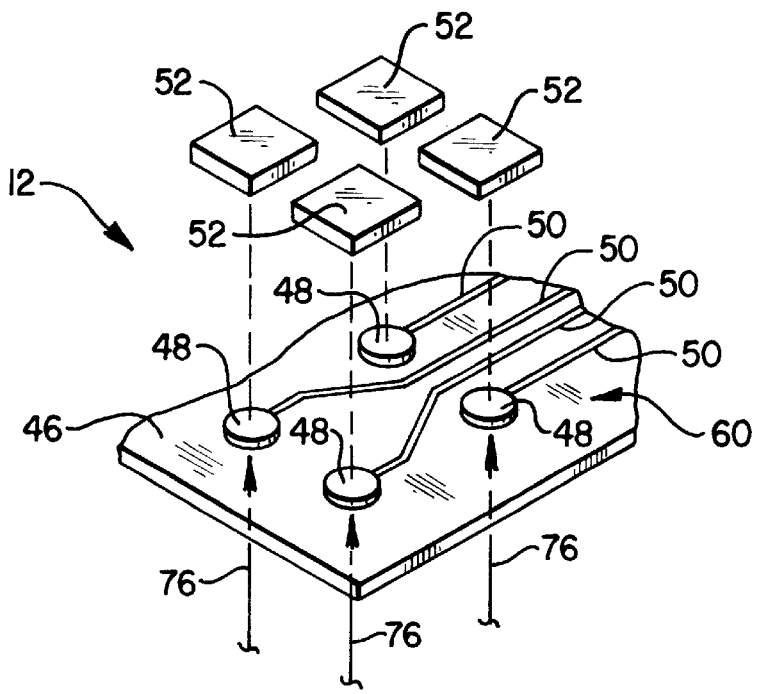
FIG. 2 is an enlarged scale simplified exploded perspective view of a portion of the keyboard and pointing device.
Figure 3:
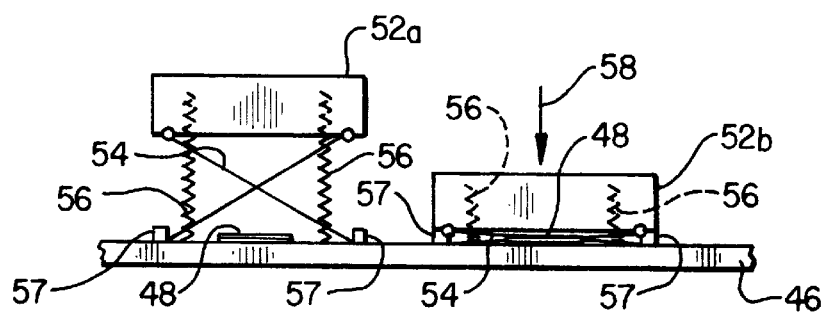
FIG. 3. is an enlarged scale simplified cross-sectional view taken through a portion of the keyboard and pointing device taken along line 3–3 of FIG. 1.

Turning now to FIGS. 1–3, the keyboard/pointing assembly 12 includes a dielectric base plate support member 46 extending across the top side of the base housing 14. Formed on the top side of the base plate 46 are a mutually spaced series of electrically conductive transceiver electrode sensor pads 48 from each of which an electrically conductive transceiver output lead 50 outwardly extends across the top side of the base plate 46. The sensor pads 48 and their associated output leads 50 are representatively formed from copper traces or screened conductive ink, but could alternatively be formed from various other types of suitable conductive materials.

Disposed above the transceiver pads 48 in horizontal registry therewith are a spaced series of key cap members 52 formed from a suitable dielectric material such as plastic, each of which is supported for vertical movement toward and away from its underlying transceiver pad 48 (as may be seen by comparing keys 52*a* and 52*b* in FIG. 3) by a suitable schematically depicted scissor linkage 54. Spring structures 56 are interconnected between the keys 52 and the base plate 46 and function to return each key 52 to its elevated position (shown on the left in FIG. 3) after the key has been manually depressed as indicated by the arrow 58 in FIG. 3. Extending upwardly from the base plate 46, beneath each key 52, are stop projections 57 which engage the keys in their depressed positions and keep them from coming into contact with and potentially damaging their underlying electrode pads 48.

The transceiver pads 48 and their associated output leads 50 form a portion of a capacitance-based sensing system 60 (see FIGS. 2 and 5) which is utilized to monitor, among other things, changes in the proximity of a user's fingers to each of the transceiver pads 48 as the fingers operatively depress the overlying keys associated with the pads, and use this sensed proximity change to generate corresponding keystroke and cursor control signals 62 to the computer circuitry 40 which, in turn, outputs appropriate keystroke and cursor activation signals 64.

Figure 5:
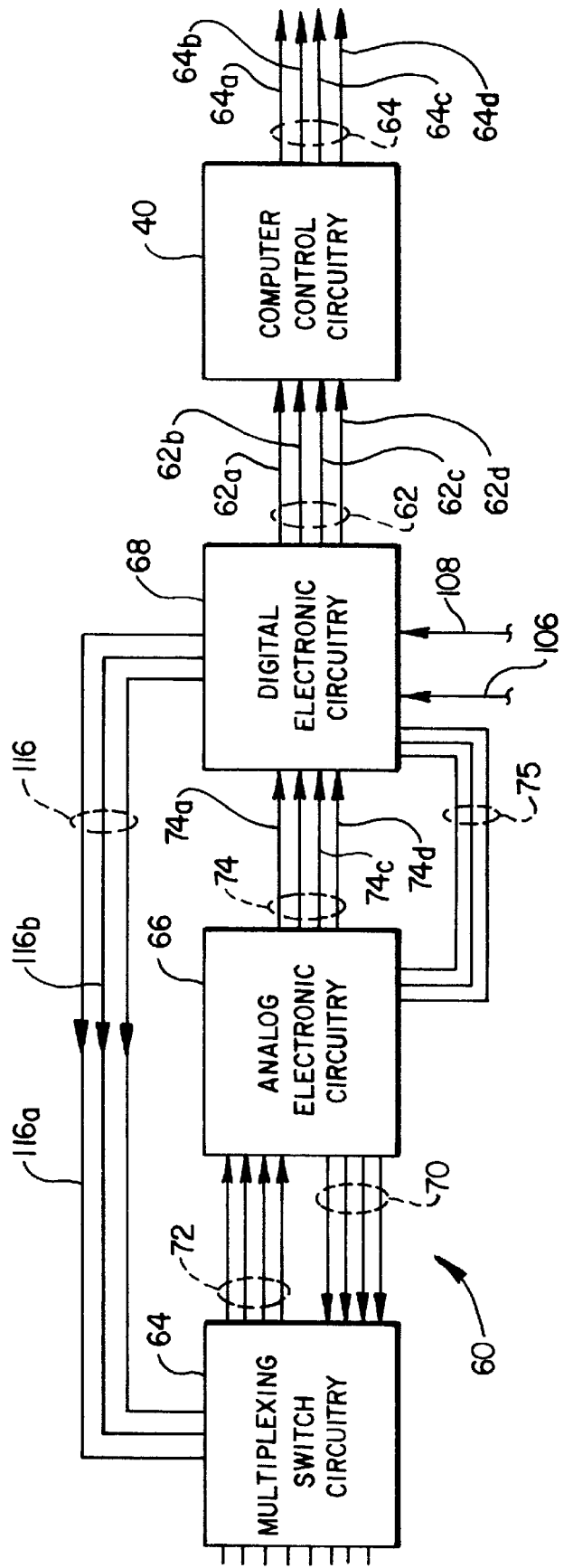
FIG. 5 is a simplified schematic electrical block diagram of the overall capacitive sensing system.

As shown in schematic block diagram form in FIG. 5, the capacitance-based proximity sensing system 60 representatively includes multiplexing switch circuitry 64, analog electronic circuitry 66, and digital electronic circuitry 68. The transceiver output leads 50, and output leads 70 from the analog circuitry 66, are connected to the input of the multiplexing switch circuitry 64. Output leads 72 from the multiplexing switch circuitry 64 are connected to the input side of the analog circuitry 66, and output leads 74 from the analog circuitry 66 are connected to the input side of the digital circuitry 68. Additionally, suitable control leads 75 are routed from the digital circuitry 68 to the analog circuitry 66 to control the gain, offsets, biases and other operational aspects of the analog circuitry 66. As will be readily appreciated, in the schematic block diagram shown in FIG. 5 the indicated numbers of electrical leads in each lead set are illustrative only.

During operation of the computer 10, predetermined AC electrical signals 76 (see FIG. 2) are impressed on the transceiver pads 48 (which, as the name implies, act as both receivers and transmitters) by a wave form generator portion 78 (see FIG. 4) of the analog circuitry 66 via the leads 70, the multiplexing switch circuitry 64 and the transceiver leads 50 shown in FIG. 5. Via a switch 80, a resistored lead 82, and branch leads 84 and 86, the output of the wave form generator 78 is coupled to the grounded positive input terminals of first and second operational amplifiers 88 and 90. The output of the first amplifier 88 is connected to the negative input terminal of the second amplifier 90 by a resistored lead 92, the output of the second amplifier 90 is connected to the input of a synchronous detector 94 by lead 96, and the leads 92 and 96 are connected by a resistored lead 98. The negative input terminal of the first amplifier 88 is connected to its output lead 92 by a lead 100 in which the indicated resistor and capacitor are connected in parallel.

Figure 4:
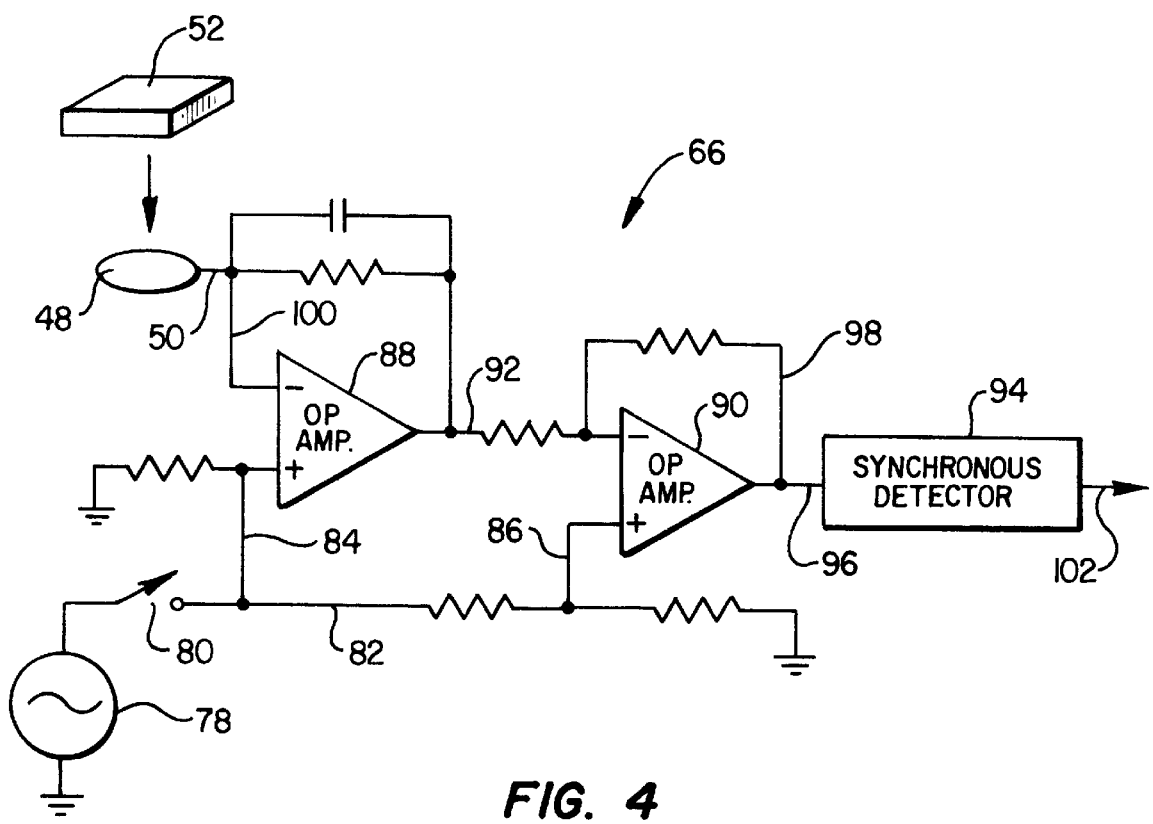
FIG. 4 is a schematic electrical circuit diagram illustrating the capacitive sensing operation of the system relative to one of the keyboard key members.

As each key 52 is manually depressed toward its underlying transceiver pad 48, the proximity to the transceiver of the user's finger which is depressing the key is reduced, thereby correspondingly altering the capacitance component of the transceiver's impedance. By means of the multiplexing circuitry 64, and its output leads 72 (see FIG. 5), an output signal indicative of the pad's altered capacitance is transmitted through the pad output lead 50 (as schematically indicated in FIG. 4) to the lead 100 and thus to the negative input terminals of the amplifiers 88 and 90. The synchronous detector 94 monitors the output of the second amplifier 90 and responsively generates an output signal 102 which is indicative, via the sensed capacitance changes at the transceiver pad 48, of both the proximity of the key-depressing finger to the underlying transceiver pad 48 and the rate of movement of the finger (both its velocity and acceleration) toward or away from the underlying pad 48.

While the transceiver lead 50 is schematically depicted in FIG. 4 as being directly connected to the amplifier portion 88 of the analog circuitry 66, it will be readily appreciated that this connection is merely representative of the connection of each lead 50 to the analog circuitry via the multiplexing circuitry 64 and its output leads 72. Further, the circuitry schematically shown in FIG. 4 is representative of the functions performed on each transceiver output signal received by the analog circuitry 66 via the illustrative leads 72. Moreover, while in the circuitry shown in FIG. 4 the representative transceiver lead 50 is shown as being directly coupled to the analog circuitry for simplicity in explanation, it will be appreciated that, as shown in FIG. 5, the analog circuitry 66 is operatively coupled to all of the transceiver pad leads 50 via the leads 70 and the multiplexing switch circuitry 64.

The signals 102 outputted by the synchronous detector portion 94 of the analog circuitry 66 are transmitted from the analog circuitry 66 via the representative output leads 74 to the digital circuitry 68 which appropriately converts these analog signals to digital form and transmits the processed digital signals via leads 62 to the computer control circuitry 40 for use in generating suitable keystroke and cursor control signals via its representative output leads 64.

The capacitance-based keyboard/pointing assembly 12 has two available modes—(1) a typing mode, and (2) a cursor control mode. In one embodiment of the invention, a manual switch 104 (see FIG. 1) is provided to permit the user of the computer 10 to select either the typing mode or the cursor control mode. Switch 104 is representatively located on the top side of the base housing 14, in front of the keyboard/pointing assembly 12. When switch 104 is activated it transmits a signal 106 to the digital circuitry 68 (see FIG. 5) which operates to place the capacitance system 60 in its cursor control mode. When the switch 104 is de-activated, the signal 106 terminates and the system 60 returns to its typing mode.

With the system 60 in its typing mode, the operative manual depression of any selected one of the keys 52 is capacitively sensed by its underlying pad 48, thereby causing the analog circuitry 66 (see FIG. 5) to output a corresponding analog output signal 74a which is indicative of the particular key that is struck, and its keystroke velocity and acceleration. The analog output signal 74a is converted by the digital circuitry 68 to a corresponding digital output signal 62a which is transmitted to the computer control circuitry 40. The computer control circuitry 40 responsively outputs a signal 64a which is used to display on the screen 36 the character or number associated with the depressed key.

According to a feature of the present invention, in response to an appropriate user input 108 to the digital circuitry 68, the digital circuitry 68 may be made operative to output a modified keystroke signal 62b in response to the incoming analog keystroke signal 74a if the sensed finger velocity of the keystroke is above a predetermined minimum value indicative of an intentionally "hard" keystroke akin to a harder/faster accenting stroke made by a musician on a piano key. In response to receipt of the modified digital circuitry output signal 62b, the computer control circuitry 40 outputs a modified output signal 64b which correspondingly modifies the key character image displayed on the screen in response to striking the particular key.

This feature of the invention may be illustratively used to capitalize, bold or underline the character associated with the struck key. For example, if the "A" key is struck at a normal velocity (i.e., below the predetermined keystroke velocity), and the automatic capitalization feature is selected by the user via the input signal 108, the character "a" is responsively displayed on the screen 36. However, in response to the user striking the key harder (i.e., faster), the system 60 automatically functions via the computer control circuitry 40 to display the capital letter "A" on the screen—without the user having to strike the "shift" key to obtain such capitalization. As used herein, the term "capitalization" includes not only the change from lower case to upper case of a particular letter, but also the "shifted" character (for instance "&") associated with a number or other character (such as the number "7").

In this manner the display of the image associated with a depressed key is automatically altered as a function of its key stroke velocity. This sensed velocity-based alteration of a displayed key character image could also be used in a variety of other manners —for example, to bold, underline or italicize the displayed key character. Additionally, non-typing functions can also be controlled in response to sensed variations in keystroke velocity—for example, speaker volume, screen brightness, or a variety of other user-defined functions for a particular application being used.

Figure 6:
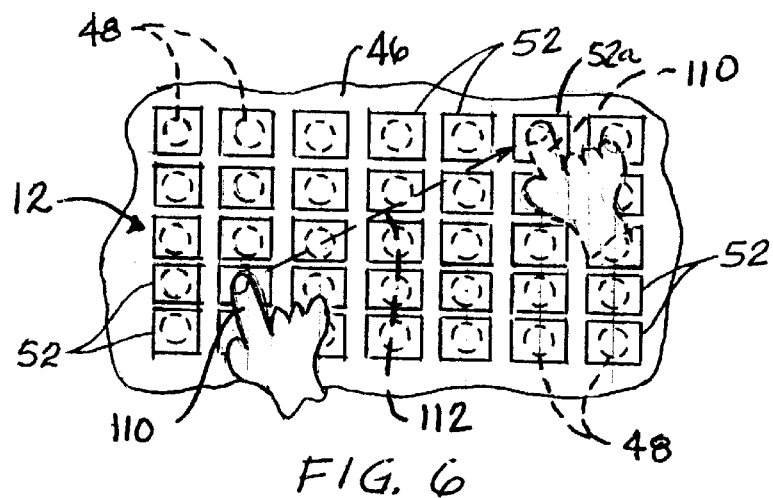
FIG. 6 is an enlarged scale simplified top plan view of a portion of the device illustrating its use in a pointing mode.

Switching the capacitance system 60 to its pointing mode utilizing the switch 104 permits the user, as schematically depicted in FIG. 6, to simply move his finger 110 in a desired cursor movement direction (for example, in the direction of the dashed arrow 112 in FIG. 6) along the tops of the keys 52. As his finger tip passes over the pads 48 underlying these keys, the pads transmit their altered capacitance signals via the multiplexing switch circuitry leads 72 (see FIG. 5) to the analog circuitry 66. In response, the analog circuitry 66 outputs a signal 74c to the digital circuitry 68 which is indicative of the capacitive pad output sequence and thus the path of the finger 110 along the top of the keyboard.

The converted signal 62c output by the digital circuitry 68 is used by the computer control circuitry 40 to generate an output signal 64c that moves the cursor 42 along the dashed line path 112a (see FIG. 1) corresponding to the finger movement direction 112 shown in FIG. 6. As illustrated in FIG. 1, the relocated, dashed line cursor 42 is aligned with the representative selectable icon 44. To "select" the icon 44 the user simply taps the key 52a (see FIG. 6) at the end of the path 112 with his finger 110. Alternatively, a finger on the user's other hand can be used for this selection function. This tapping movement, which only partially depresses the key 52a, is sensed by the underlying pad 48 whose resulting capacitance signal is used (for example, via the cursor control signal 64c shown in FIG. 5) to exercise the pick function schematically illustrated by the asterisk 114 in FIG. 1.

While the capacitance system 60 may, as described above, be selectively switched between its typing and pointing modes using the manual switch 104 shown in FIG. 1, according to another feature of the present invention the system may be automatically switched by appropriately structuring the digital circuitry 68 to distinguish (via the analog circuit output signals 74 received thereby) between a typing mode (i.e., when the keys 52 are being sequentially struck without substantial hand movement over the keyboard) and a cursor control mode in which the user's hand is moving across the top of the keyboard (such as in FIG. 6) without operatively striking the keys. In response to sensing a switch between typing and pointing hand and finger motion characteristics in this manner, the digital circuitry 68, via feedback signals 116 to the multiplexing switch circuitry 64, automatically switches the system 60 between its typing and pointing modes without the use of the manual switch 104 shown in FIG. 1.

As an example, if the system 60 is initially in a typing mode when the user moves his finger 110 across the top of the keys 52 as shown in FIG. 6 to reposition the cursor 42, the digital circuitry 68 generates a feed back signal 116a to the multiplexing switch circuitry 64 to cause it to appropriately alter its output signals 72 to switch the system 60 to from its typing mode to its pointing mode. The schematically illustrated user input 108 shown in FIG. 5 may be utilized to switch between this automatic typing/pointing mode switchover and a manual switchover using the switch 104.

Figure 7:
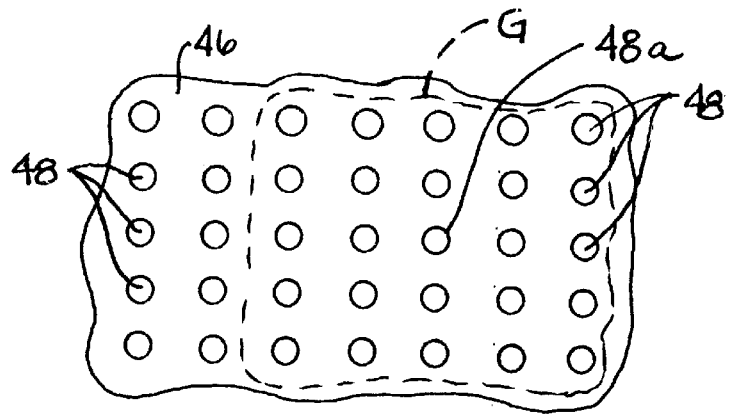
FIG. 7 is an enlarged scale simplified top plan view of a portion of the device with its key cap members removed for illustrative purposes and showing a "grouping" of a set of capacitance transceivers for hand motion detection purposes.

Thus far, the electrically conductive pads 48 that underlie the keys 52 have been described as functioning as transceivers—i.e., every pad 48 acting both as an electrical transmitter and an electrical receiver. However, according to another feature of the present invention, as schematically illustrated in FIG. 7 a group G of the pads 48 (which may comprise some or all of the pads 48) may be converted to a separate transmitting and receiving pad set in which one of the pads 48a in the group functions solely as a transmitter and the rest of the pads 48 in the group function solely as receivers. Alteratively, more than one such group of pads 48 may be converted to a separate transmitting and receiving pad set. This switchover is utilized in conjunction with changing the system 60 from its typing mode to its pointing mode, and facilitates the system's recognition of various motion and position characteristics of the user's hand.

For example, with some or all of the pads 48 being "grouped" as schematically shown in FIG. 7, the user may repeatedly move his right hand 118 to the right across the top of the keys 52, with the palm facing to the left, in a "page turning" motion to scroll through sequential pages in an on-screen document. The change in capacitance in the ones of the grouped pads 48 which his hand passes over is sensed by the system 60 which responsively causes the analog circuitry 66 to output a corresponding signal 74d which is converted by the circuitry 68 to a digital signal 62d used by the computer control circuitry 40 to output a control signal 64d that causes the desired on-screen scrolling of text. As will be appreciated, the system 60 is also capable of detecting and utilizing three dimensional hand movements—i.e., those in which the hand movement also has a vertical component.

The switchover between typing and pointing modes may be effected using the manual switch 104, or using the automatic switchover technique previously described. For example, when the user hand position and motion shown in FIG. 8 is detected by the capacitive sensing system 60 the digital circuitry 68 may be structured to responsively output a feedback signal 116b to the multiplexing switch circuitry 64 which, via its output signals 72, switches the system 60 to the desired pointing mode.

Figure 8:
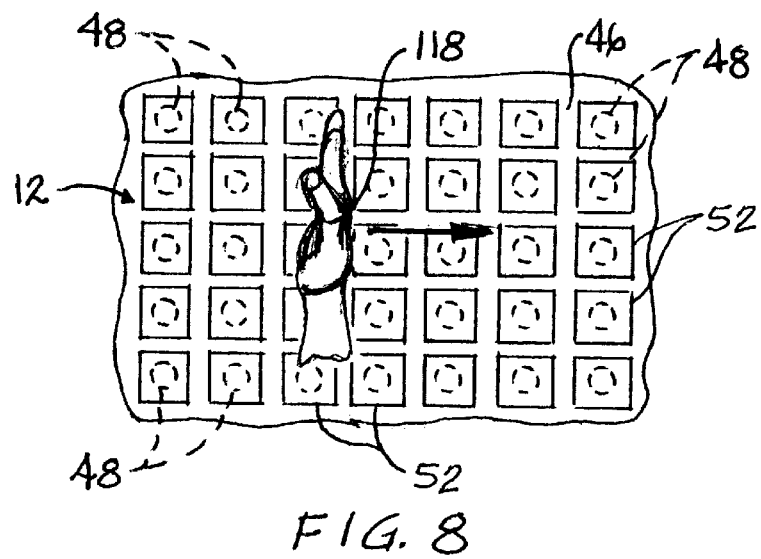
FIG. 8 is a view similar to that in FIG. 6, but with the device being used to sense the motion of a user's hand with the capacitance transceivers being grouped as shown in FIG. 7.

As will be readily appreciated by those of skill in this particular art, the hand position and motions shown in FIGS. 6 and 8 are merely representative of many hand positions and motions that could be sensed and utilized by the capacitive system 60. Additionally, using a variable user input 108 to the system 60, a variety of hand motion and key stroke velocity functions other than those illustratively described herein could be utilized if desired.

The keyboard/pointing assembly 12 of the present invention is of a desirably thin and mechanically quite reliable construction since the keys 52 are provided primarily to afford the desired typing "feel" to the user, and do not act to repeatedly depress and release mechanical switch devices. Instead, as described in detail above, the system 60 capacitively senses the proximity, velocity and acceleration of a user's fingers relative to the underlying pads 48 to provide the various typing and cursor control functions described in detail herein.

While the keyboard/pointing assembly 12 has representatively been illustrated herein as being incorporated in a portable computer, it will be readily appreciated by those of skill in this particular art that principles of the present invention could also be advantageously incorporated into the keyboard portions of computers of other types, such as desktop computer systems, as well as into keyboards of other types of electronic devices, if desired.

The foregoing detailed description is to be clearly understood as being given by way of illustration and example only, the spirit and scope of the present invention being limited solely by the appended claims.

What is claimed is:

1. Electronic apparatus comprising: a combination keyboard/pointing device including:
   a support member having a top side,
   a series of keys carried on said support member for movement through stroke distances toward said top side, and
   capacitance-based proximity sensing circuitry including proximity sensors disposed beneath said keys. said canacitance-based proximity sensing circuitry being switchable between:
   (1) a typing mode in which said circuitry, via said proximity sensors capacitively senses changes in the proximity of a user's fingers to said top side while the fingers are depressing said keys through said stroke distances, and responsively generates signals useable to generate corresponding typing characters on a screen, and
   (2) a pointing mode in which said circuitry, via the same proximity sensors, capacitively senses predetermined user hand orientations and movements upwardly adjacent said keys and responsively generates signals useable to control a movable cursor on a screen.

2. The electronic apparatus of claim 1 further comprising a screen on which said typing characters and said movable cursor may be displayed.

3. The electronic apparatus of claim 2 wherein said electronic apparatus is a computer.

4. The electronic apparatus of claim 3 wherein said computer is a portable computer.

5. The electronic apparatus of claim 4 wherein said portable computer is a notebook computer.

6. The electronic apparatus of claim 1 further comprising a manual switch operative to selectively switch said circuitry between one of said typing and pointing modes and the other of said typing and pointing modes.

7. The electronic apparatus of claim 1 wherein, with said circuitry in said typing mode, said circuitry is operative to sense a predetermined user hand orientation and movement along and upwardly adjacent said keys and responsively switch to said pointing mode.

8. The electronic apparatus of claim 1 wherein, with said circuitry in said pointing mode, said circuitry is operative to sense the direction of movement of a portion of a user's hand along and upwardly adjacent said keys and responsively generate a signal useable to move the cursor along the screen in a direction related in a predetermined manner to the user's hand direction movement.

9. The electronic apparatus of claim 1 wherein, with said circuitry in said pointing mode, said circuitry is operative to sense a tapping of one of said keys and responsively generate a cursor pick signal.

10. The electronic apparatus of claim 1 wherein, with said circuitry in said pointing mode, said circuitry is operative to sense the movement of a user's hand along and upwardly adjacent said keys and responsively generate a page scrolling signal.

11. The electronic apparatus of claim 1 wherein, with said circuitry in said typing mode, said circuitry is operative to capacitively sense the key stroke velocity of each key and responsively generate (1) a first signal useable to display on a screen a first key character image when the sensed key stroke velocity of the key is in a first predetermined range, and (2) a second signal useable to display on a screen a second key character image when the sensed key stroke velocity of the key is in a second predetermined range.

12. The electronic apparatus of claim 1 wherein said electronic apparatus is a computer having computer control circuitry, and said capacitance-based proximity sensing circuitry includes:
   a spaced series of electrically conductive pad structures underlying said keys in registry therewith and acting as said proximity sensors,
   means for impressing predetermined alternating wave forms on said pad structures,
   multiplexing switch circuitry having an input side connected to said pad structures, and an output side,
   analog electrical circuitry having an input side connected to said output side of said multiplexing switch circuitry, and an output side, said analog electrical circuitry being operative to sense capacitance changes at said pad structures caused by changes in proximity of objects adjacent thereto, and responsively generate analog output signals, and
   digital electrical circuitry for receiving said analog output signals, converting them to digital signals, and transmitting said digital signals to said computer control circuitry.

13. The electronic apparatus of claim 1 wherein:

said circuitry includes a spaced series of electrically conductive pad structures underlying said keys in registry therewith and acting as said proximity sensors, and said circuitry is operative to cause said pad structures to function as electrical transceivers during said typing mode.

14. The electronic apparatus of claim 13 wherein said circuitry is further operative to cause said pad structures to function as electrical transceivers during said pointing mode.

15. The electronic apparatus of claim 13 wherein said circuitry, when in said pointing mode, is operative to cause at least one of said pad structures to function solely as an electrical transmitter, and to cause at least a portion of the balance of said pad structures to function solely as electrical receivers.

16. The electronic apparatus of claim 11 wherein:

said support member is a dielectric plate member, said circuitry includes a spaced series of electrically conductive pad structures disposed on said top side of said dielectric plate member, underlying said keys in registry therewith, and acting as said proximity sensors and each key has associated therewith a spring structure operative to resiliently bias the key toward an outwardly extended position relative to said top side of said dielectric plate member, and a stop structure operative to prevent the key from contacting its underlying pad structure when the key is depressed through its full stroke distance.

* * * * *

UNITED STATES PATENT AND TRADEMARK OFFICE
CERTIFICATE OF CORRECTION

PATENT NO. : 6,204,839 B1
DATED : March 20, 2001
INVENTOR(S) : Stephan A. Mato, Jr.

It is certified that error appears in the above-identified patent and that said Letters Patent is hereby corrected as shown below:

<u>Claims, column 9,</u>
Lines 3-4, please delete " keys. said canacitance-based" and replace with -- keys, said capacitance-based --.

Signed and Sealed this

Twenty-fifth Day of September, 2001

Attest:

*Attesting Officer*

NICHOLAS P. GODICI
*Acting Director of the United States Patent and Trademark Office*